United States Patent [19]
Aschenbrenner et al.

[11] Patent Number: 5,928,458
[45] Date of Patent: Jul. 27, 1999

[54] FLIP CHIP BONDING WITH NON CONDUCTIVE ADHESIVE

[75] Inventors: Rolf Aschenbrenner; Jörg Gwiasda; Elke Zakel, all of Berlin, Germany; Joachim Eldring, Phoneix, Ariz.

[73] Assignee: Fraunhofer-Gesellschaft Zur Forderung Der Angewandten Forschung E.V., Munich, Germany

[21] Appl. No.: 08/776,936
[22] PCT Filed: Apr. 13, 1995
[86] PCT No.: PCT/EP95/01388
  § 371 Date: Apr. 10, 1997
  § 102(e) Date: Apr. 10, 1997
[87] PCT Pub. No.: WO96/05614
  PCT Pub. Date: Feb. 22, 1996

[30] Foreign Application Priority Data
Aug. 12, 1994 [EP] European Pat. Off. ............. 94112626

[51] Int. Cl.⁶ .................................................. H05K 13/04
[52] U.S. Cl. ........................................ 156/307.1; 156/292
[58] Field of Search ................................. 156/292, 307.1; 174/250

[56] References Cited

U.S. PATENT DOCUMENTS

| | | | |
|---|---|---|---|
| 4,749,120 | 6/1988 | Hatada | 228/123 |
| 5,001,542 | 3/1991 | Tsukagoshi et al. | 357/68 |
| 5,027,995 | 7/1991 | Karl et al. | 228/111 |
| 5,071,787 | 12/1991 | Mori et al. | 437/183 |
| 5,120,665 | 6/1992 | Tsukagoshi et al. | 437/8 |
| 5,296,063 | 3/1994 | Yamamura et al. | 156/64 |

FOREIGN PATENT DOCUMENTS

| | | |
|---|---|---|
| 0528171A2 | 2/1993 | European Pat. Off. |
| 0596393A1 | 5/1994 | European Pat. Off. |

OTHER PUBLICATIONS

Flip Chip Technology held in conjunction with the Sixth International Tab/Advanced Packaging Symposium (held on Feb. 15–18, 1994 in San Jose, CA, USA).

*Primary Examiner*—Francis J. Lorin
*Attorney, Agent, or Firm*—Eckert Semans Cherin & Mellott, LLC

[57] ABSTRACT

The invention concerns flip chip technology using non-conductive adhesives and gold ball bumps or connectors. The concept is to simultaneously attach and interconnect bare chips with gold ball bumps to organic substrates. The chip is fixed by cooling the insulative adhesive. Environmental testing has demonstrated that performance characteristics were acceptable after 1000 hours of continuous exposure to humidity, and were excellent after 1000 temperature cycles. Such stable interconnections can only be realized by the compliance of the flip chip joint. This stability, can be achieved by precise control of the bonding parameters such as temperature and pressure. This bonding technique allows quality attachment of bare chips on low cost organic substrates.

7 Claims, 13 Drawing Sheets

Substrate electrode

|  | Substrate 1 | Substrate 2 |
|---|---|---|
| Material | FR-4 | FLEX (Espanex) |
| Size | 2"x2" | 2"x2" |
| Electrode | Cu/Ni/Au | Cu/Ni/Au |
| IC | | |
| Size | 5.0x5.0mm, 7.5x7.5mm | |
| Pitch | 200 μm, 300 μm | |
| Pad Size | 80 μm octagonal | |
| Bumps | Au stud bumps | |

| Items | Specifications |
|---|---|
| Type | Thermosetting/Thermoplastic Film |
| Maximum Cont. Operation Temp [°C] | +125 °C |
| Moisture Absorption (85 °C/85%RH) | 1.2% |
| Final Bonding | 20s at 180 °C; 20 kg/cm² |

FLIP CHIP BONDING WITH NON CONDUCTIVE ADHESIVE

BACKGROUND OF THE INVENTION

The invention concerns the field of microelectronics packaging technology. Various bonding methods and mediums may be used to attach the IC die. Since the development of the flip chip mounting process using solder by IBM (C4 process) in the early 1960's, the face down bonding technology has become popular and manifold and original interconnection methods have been reported. At the same time the interest in flip chip bonding is being driven by demands for substrates accepted in the consumer field. Therefore the substrates which are to be bonded by flip chip have been changing from inorganic to organic, such as polyimide foil and printed circuit boards (often FR-4). By using solder alloys it is possible to attain low resistance as well as a good thermal contact between the chip and the packaging substrate, including FR-4 and polyimide flex with the use of encapsulants. The result is an improvement in the thermal life cycle of flip chips mounted on high CTE packaging substrates.

The interest in flip chip assemblies using adhesives for high density, fine pitch and high performance interconnections has increased rapidly. In this context a new flip chip technology is suggested using non-conductive adhesives in place of the known stiffenable resin (cf. U.S. Pat. No. 4,749,120). The concept is to simultaneously attach and electrically interconnect bare chips with gold stud bumps to many types of packaging substrates, the bumps having a certain shape to ease the piercing through the sheet or sheet-foil of adhesive. By this interconnection method, the chip is bonded face down and is electrically connected via compressed and deformed gold ball bumps with the organic substrate. The chip is fixed by the non-conductive adhesive film which fills the entire gap between the die (the bare chip) and packaging substrate. The new method obtains greater compliance or flexibility, especially advantageous for organic substrates.

Compared to U.S. Pat. No. 4,749,120 (Hatada, Matsushita) the bonding by heat was extraordinarily accelerated although physical bonding parameters were improved and flexibility (compliance) of the bonded microelectronic package was obtained.

The adhesive is best to be applied in sheet foil form.

An exemplary non-conductive adhesive film was studied with an emphasis on the properties of COF (chip on flex) and COB (chip on board) interconnections. Electrical and mechanical performance of the adhesive bonds were studied by evaluating initial contact resistance and mechanical adhesion as a function of temperature and humidity.

Both mechanical and electrical properties were measured before and after the environmental tests and compared to soldered contacts. For flip chip interconnects with a pad size of 100 $\mu m^2$ on the chip site and a contact area of approx. 60 $\mu m$ round, the resistance is less than 8 m$\Omega$. This low contact resistance can be attributed to the special process and materials applied according to the invention. Moreover, the bonding pressure, bonding temperature and time in comparison with the contact resistance were examined.

The results of the inventive concept indicate that the control of these process parameters will yield good bonding quality. Non-conductive adhesive flip chip technique offers several important advantages over solder filling materials, however, introduce other new problems. The major disadvantages are that they do not allow rework, they have manufacturability problems such as long cure time and they need high solder bumps. The use of adhesives instead of soldering in flip chip bonding on organic substrates avoids the problems with solder. Also there are potential cost benefits in the reduction of processing steps if adhesive flip chip bonding is used.

The invention is based on stud bumps and non-conductive adhesives. This technique allows quality attachment of IC's on low cost organic substrates and offers numerous advantages in the assembly of electronic circuits. These include low processing temperatures, fluxless bonding, high density interconnections, replaceability and high reliability, speeding up of the attachment process and allowing for elastic movement of the bonded microelectronic package.

The shape of the bumps is a base and a peak section being connected via a conical section; they may be of gold, to yield best results. To improve and ease the deformation during bonding, the protruding front section is softer than the base part of the bumps.

Examples and test results will demonstrate the invention in greater detail.

DESCRIPTION OF THE DRAWINGS

FIG. 2a, FIG. 2b, and FIG. 3a show the ball bump geometry. The bump shape showing a basic slightly flattened body with a protruding top or peak. The thinner top part being softer than the bottom almost ball shaped part, to more easily be deformed. Between the peak top part and the ball shaped bottom part a conical section is established, being also softer than the bottom ball shaped part. FIG. 3 demonstrates the dimensions of the bumps, here a gold bump of Au 98 Pd.

FIGS. 4a, b, c

DETAILED DESCRIPTION OF THE PREFERRED EMBODIMENTS

Figure 1:
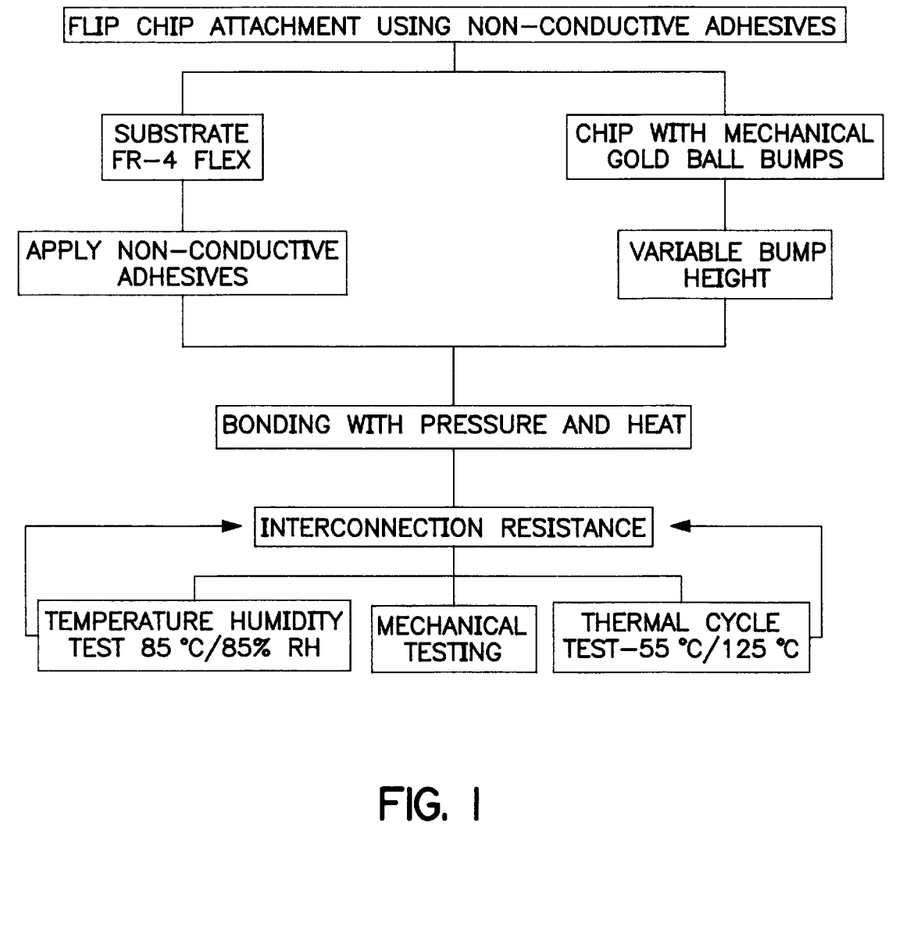
FIG. 1 is a schematic flow chart of the non-conductive adhesive flip chip process.
Figure 2A:
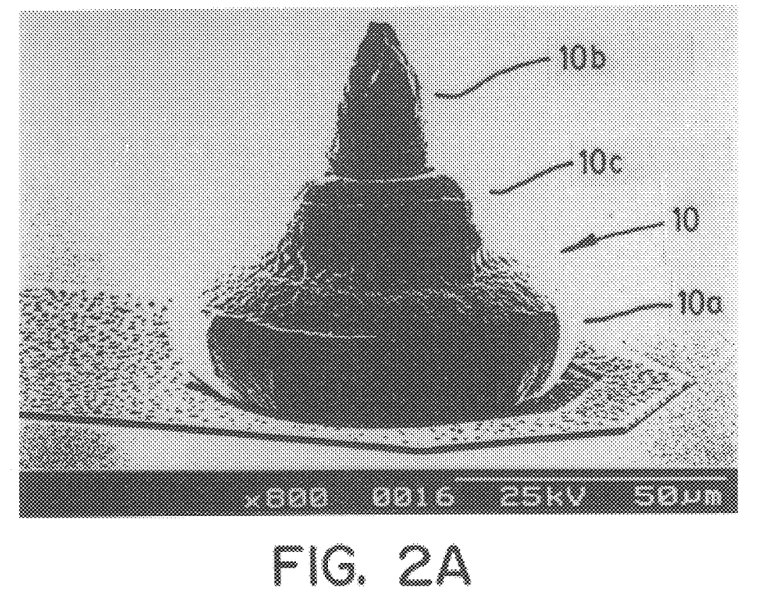
Figure 2B:
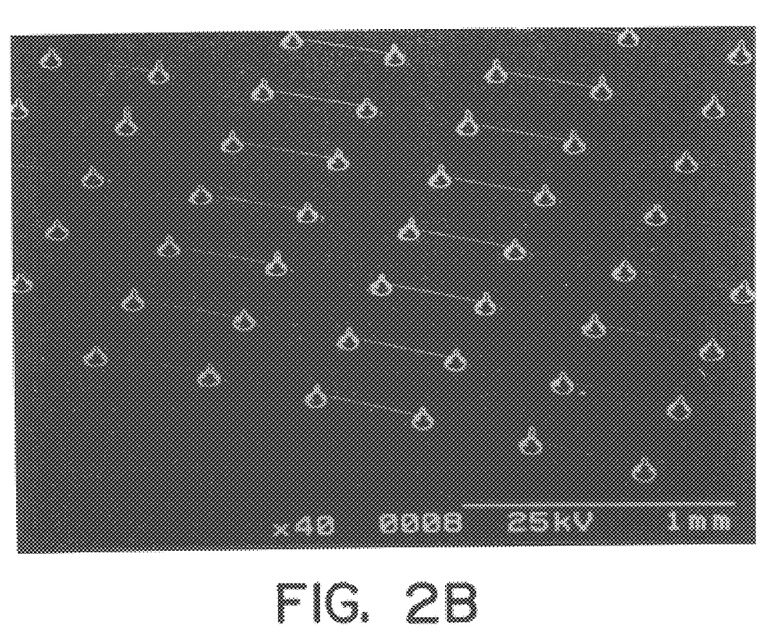
FIG. 2b is an area configuration.
Figure 3A:
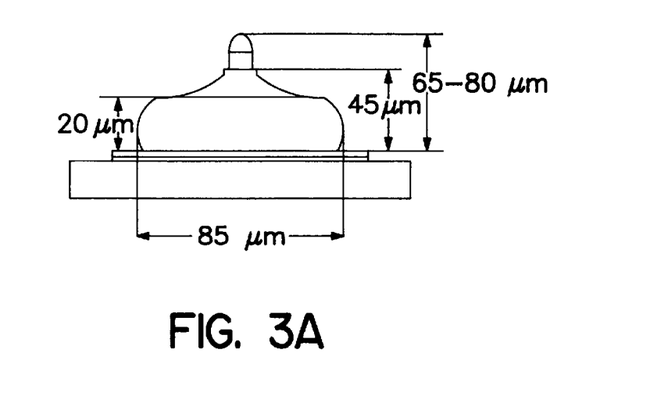
Figure 3B:
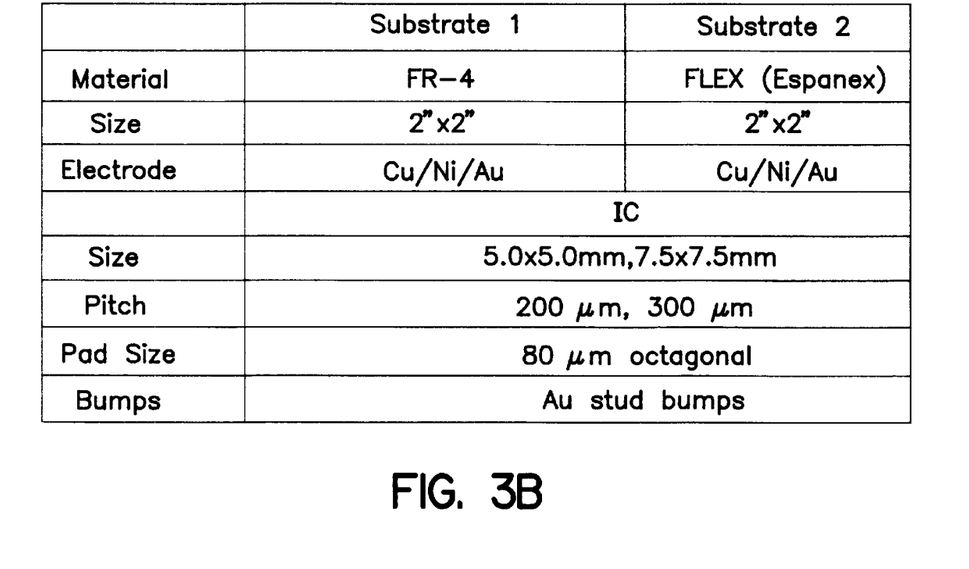
FIG. 3b is a summarized example organic board spec. (FR-4; FLEX).

Testchip and Testsubstrate:

The continuity test devices for most of this work have a size of 5 and 7.5 mm$^2$, pitches of 200 and 300 $\mu m$ and pad sizes of 80 $\mu m$ octagonal (see Table 1). The metallization is 1 $\mu m$ AlSi 1% with a PSG-passivation. The substrates used for this flip chip bonding were 1 mm thick printed circuit boards (FR-4) and 25 $\mu m$ flexprint (Espanex). The overall dimension of the substrates was 2 inch$^2$ (see FIG. 3b). The conductor patterns were gold/nickel coated copper in both cases. The printed circuit board, which was also used for flip chip attachment using solder, carries a solder mask as a finishing layer. The mask has no influence on the non-conductive adhesive process. Both test vehicles carry interconnection tracks which allow monitoring of the electrical integrity by measuring the contact resistance (four-point-probe) and transit resistance (daisy chain).

Bump Processing:

The gold ball bumps are fabricated with a flexible low cost bumping technique based on the conventional wire bonding procedure (cf. 1994, ITAP & Flip Chip Proceedings, pages 74 to 79, by J. Eldring et al.). Established wire bonding machines can be used, therefore, expensive bumping process equipment for sputtering photolithography and plating is not necessary. The sizes and geometry of ball bumps are principally dependent on the wire diameter, the geometry of the capillary as well as on the bumping parameters.

Non-Conductive Adhesive:

The adhesive film suggested, consists of insulative thermosetting/thermoplastic blend adhesive without conducting particles and fillers. The adhesive was fabricated in a dry film format with different film thicknesses of 25 μm and 50 μm. For repairing the interconnection, the whole flip chip joint is heated to a temperature of approximately 125° C. to 130° C. in order to debond the IC. Their detailed specifications as well as the bonding parameters are summarized in FIG. 6c.

Figure 4A:
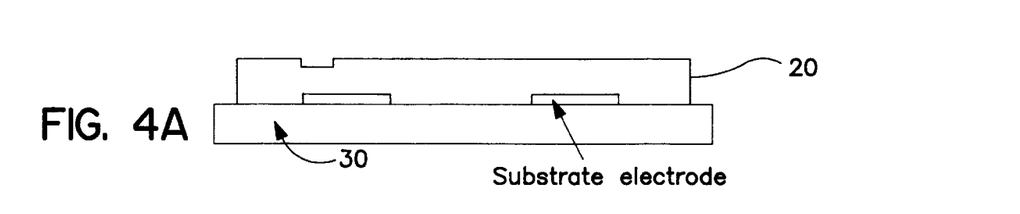
Figure 4B:
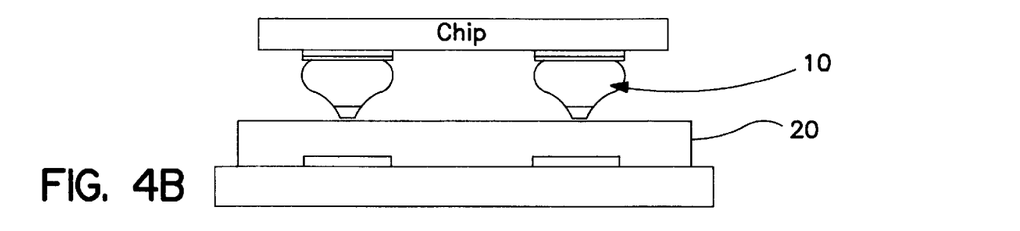
Figure 4C:
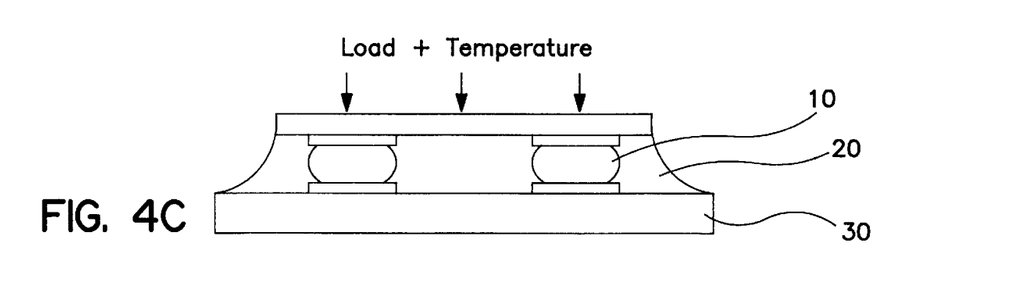

Bonding Process:

The fundamental process flow for the non-conductive adhesive flip chip attachment is shown in FIGS. 4a, b, c.

This process is made up of three basic steps:

Step 1: Non-conductive adhesive is applied to the substrate for the purpose of fixing the chip.

Step 2: The gold ball bumps on the chip and the electrodes on the substrate are aligned.

Figure 5:
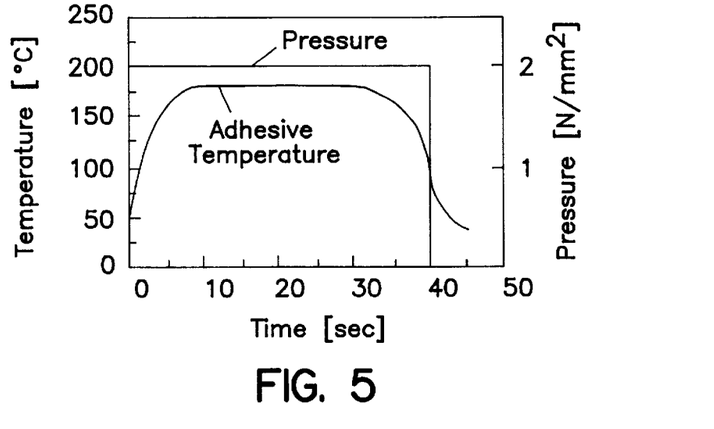
FIG. 5 is a basis example of the inventive method with temperature/pressure parameters for bonding.

Step 3: Bonding the chip on the substrate with an appropriate load (min. 20 kg/cm$^2$) and with a temperature up to 180° C. for 15 to 20 sec (see FIG. 5).

Figure 6A:
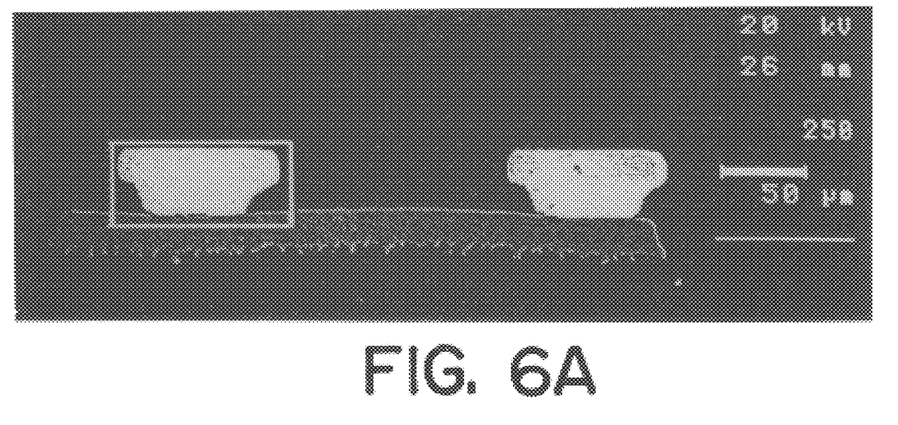
FIG. 6a and FIG. 6b are representations of bonded IC to FR-4 substrate with deformed gold bumps, showing the gold, nickel and copper interface.
Figure 6B:
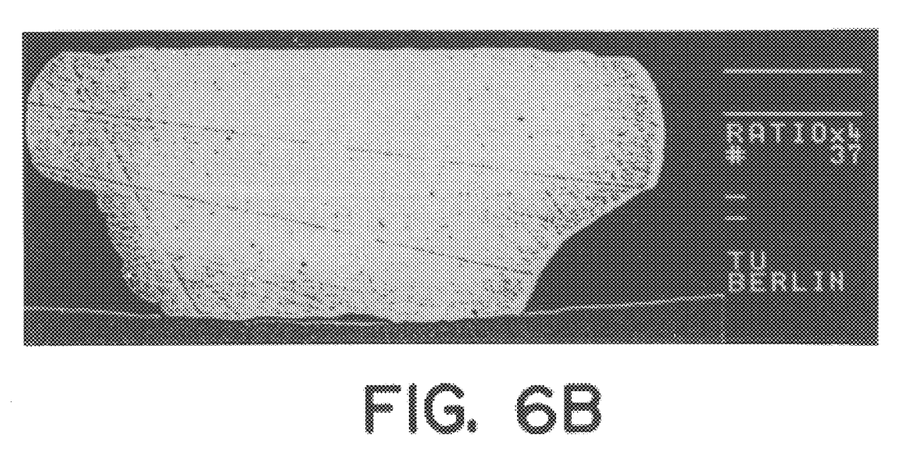
Figure 6C:
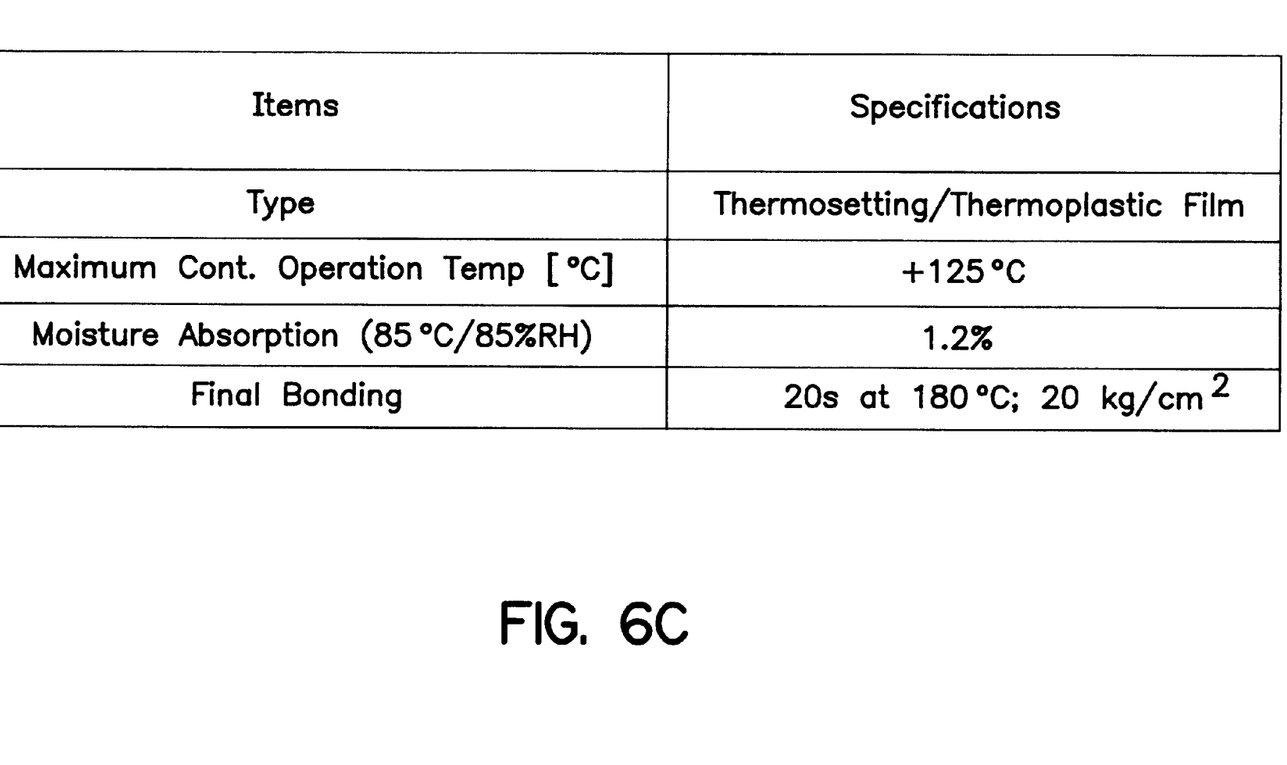
FIG. 6c is a summarized specification of the adhesive.

Thus the IC is electrically connected to the substrate via compressed and deformed gold ball bumps (see FIGS. 6a, b).

The pressure is maintained on the bond site, until the chip is fixed by cooling the thermode. The bonding process was performed with the semi-automatic flip chip bonder FC 950 from Carl Süβ (France). This piece of equipment utilizes two stage heating in the thermocompression mode and allows cooling while pressure is being maintained. Because of the accuracy needed, the bonder consists of a split-field optic to locate the chip and the substrate. The recommended temperature should be maintained throughout the total bond cycle. Therefore, the actual adhesive temperature was measured by embedding a thermocouple in the adhesive during the bonding process.

Figure 7:
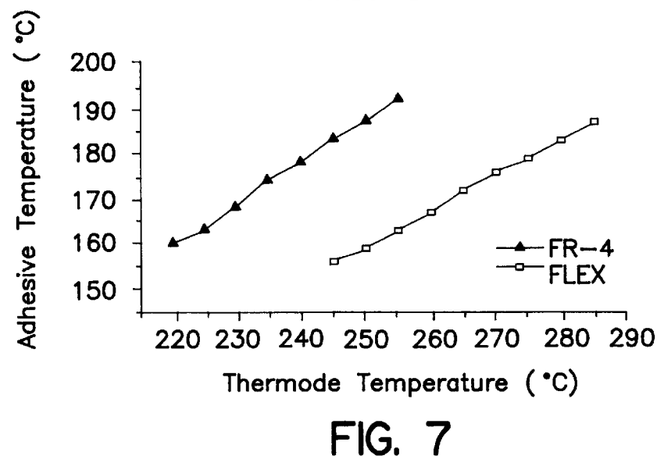
FIG. 7 shows adhesive temperature vs. thermode temperature at bonding site.

FIG. 7 shows the measured temperature difference between the thermode set point and the real bond temperature in the adhesive. The significant difference depends on the thermoconductivity of each material. The cold chuck, where the substrate is fixed by vacuum, acts as a heat sink for the flip chip joint. The combined thickness of the adhesive and substrate plays an additional role for the heat exchange.

Figure 8:
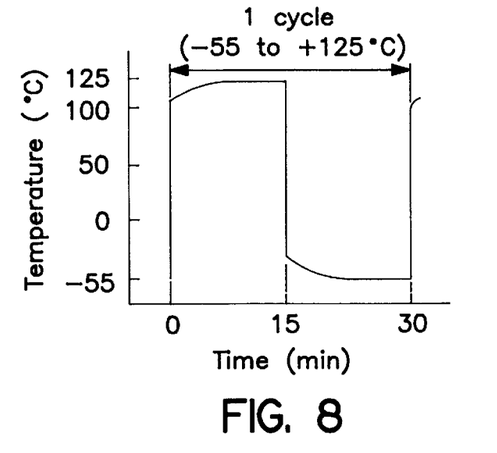
FIG. 8 is a representation of a temperature test cycle.

Reliability Tests:

In order to clearly distinguish the failure mode and degradation mechanism of non-conductive adhesive joints, both the mechanical adhesion by pull test and the electrical performance were evaluated. To obtain these data, test samples were assembled and subjected to accelerated life testing. The test method includes thermal cycling and storage at high temperature and humidity. The applied acceleration test method for thermal cycling involved 1000 cycles between −55 and +125° C., with a cycle duration of 30 minutes. Samples were measured after 50, 100, 250, 500 and 1000 cycles. The cycle regime was taken from a modification of the MIL standard 883 thermal shock test. A schematic drawing of the actual thermal cycle profile is shown in FIG. 8. The constant humidity test was performed at a constant temperature of 85° C. and at a relative humidity of 85%. The total duration of the test was 1000 hours.

Interconnection functionality was measured after 50, 100, 250, 500 and 1000 hours.

Figure 9A:
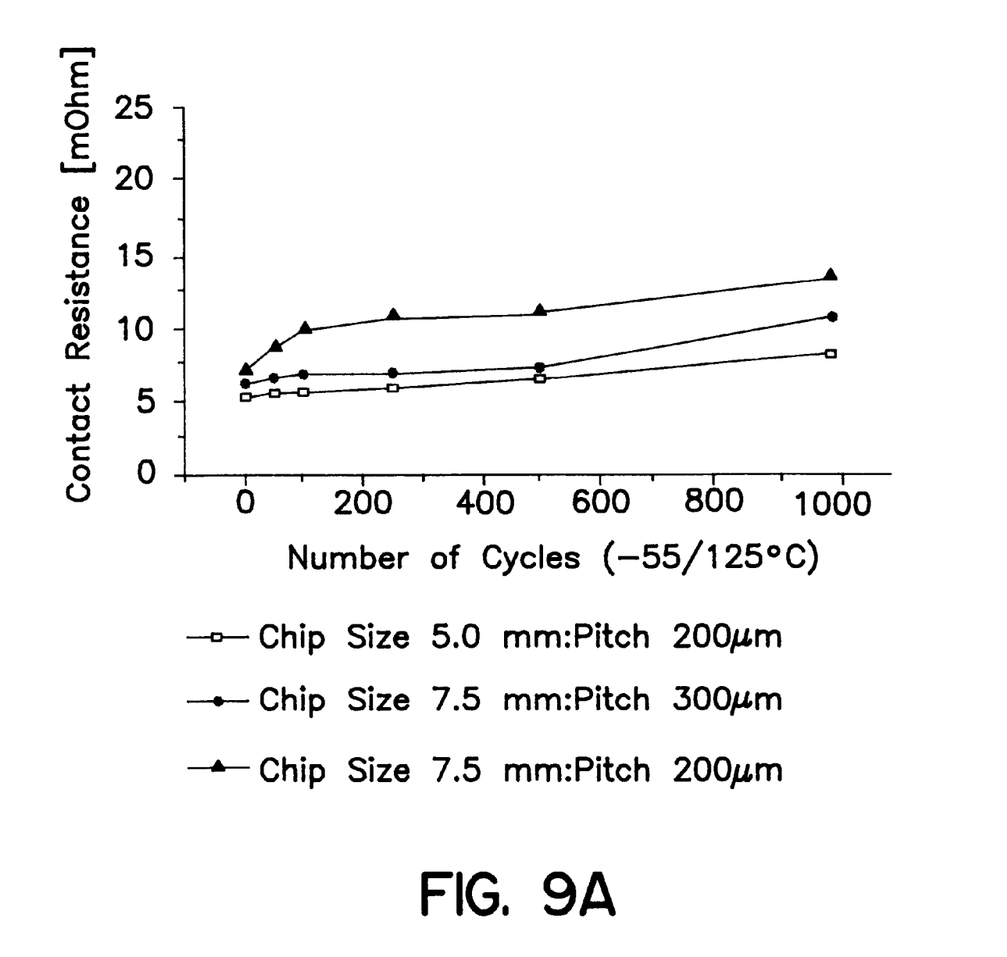
FIG. 9a and FIG. 9b show temperature test cycle results (FR-4; FLEX).
Figure 9B:
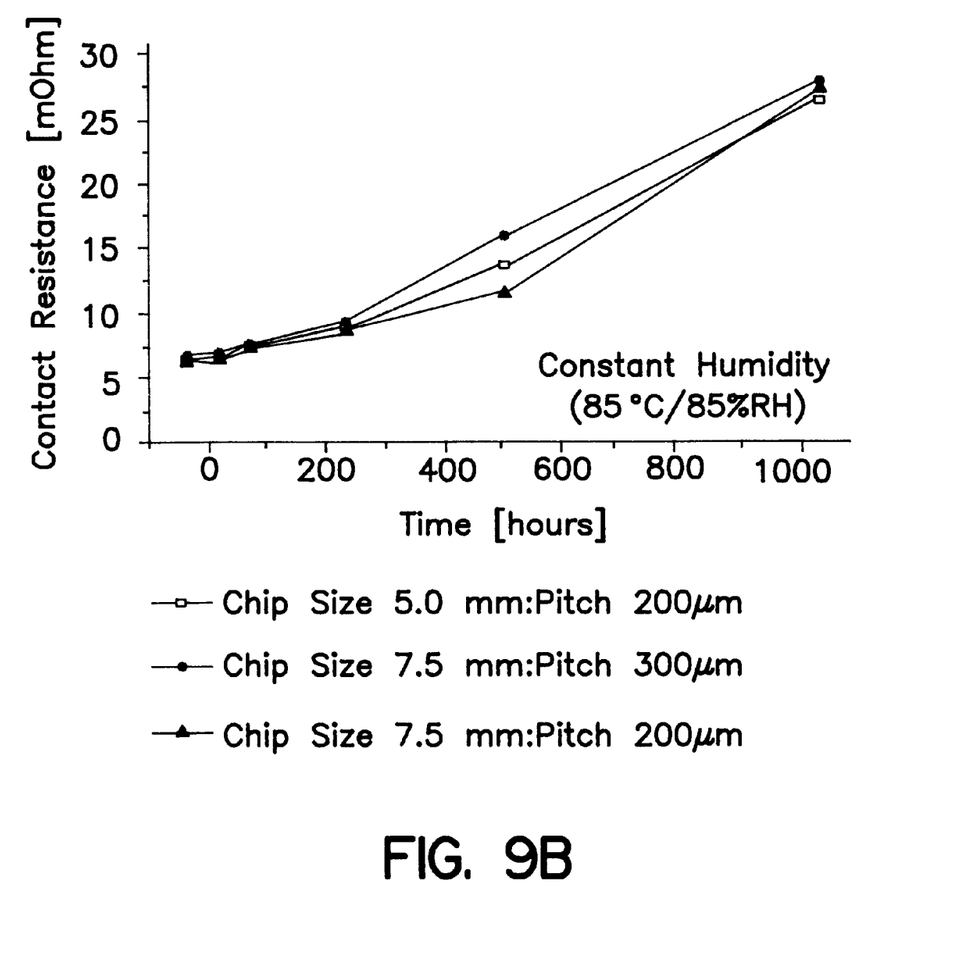
Figure 10A:
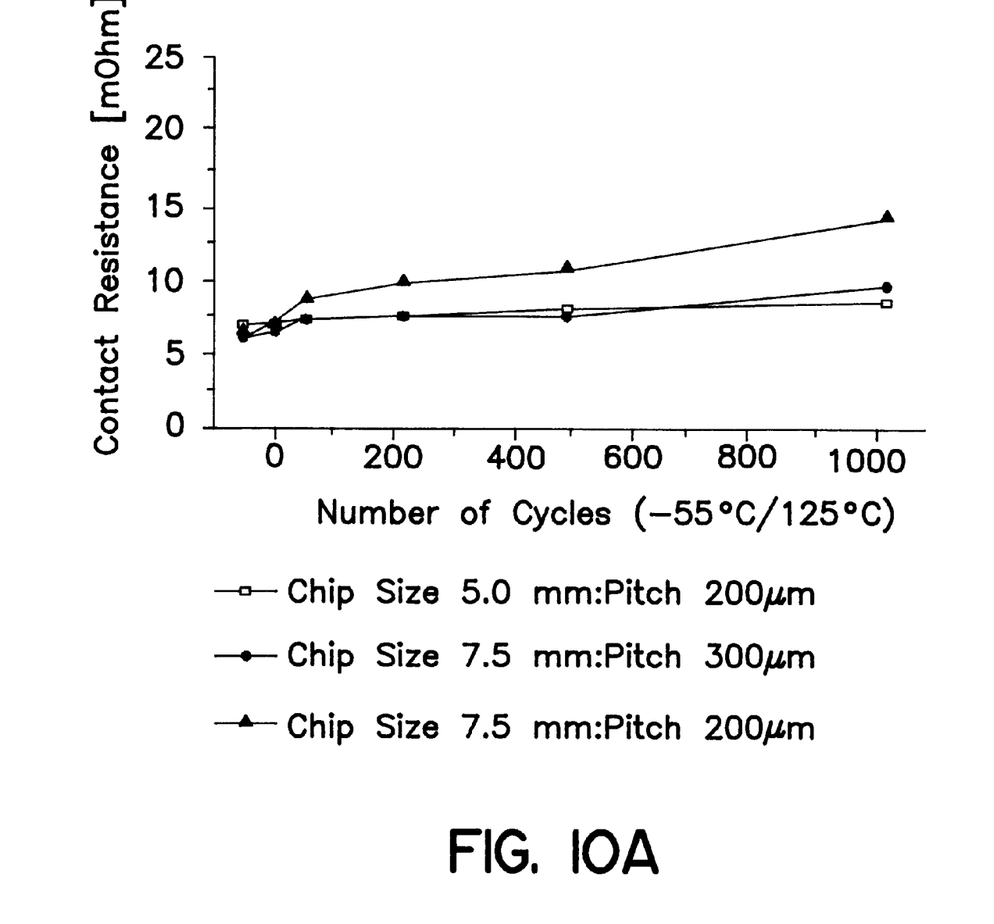
FIG. 10a and FIG. 10b show humidity test results (FR-4; FLEX).
Figure 10B:
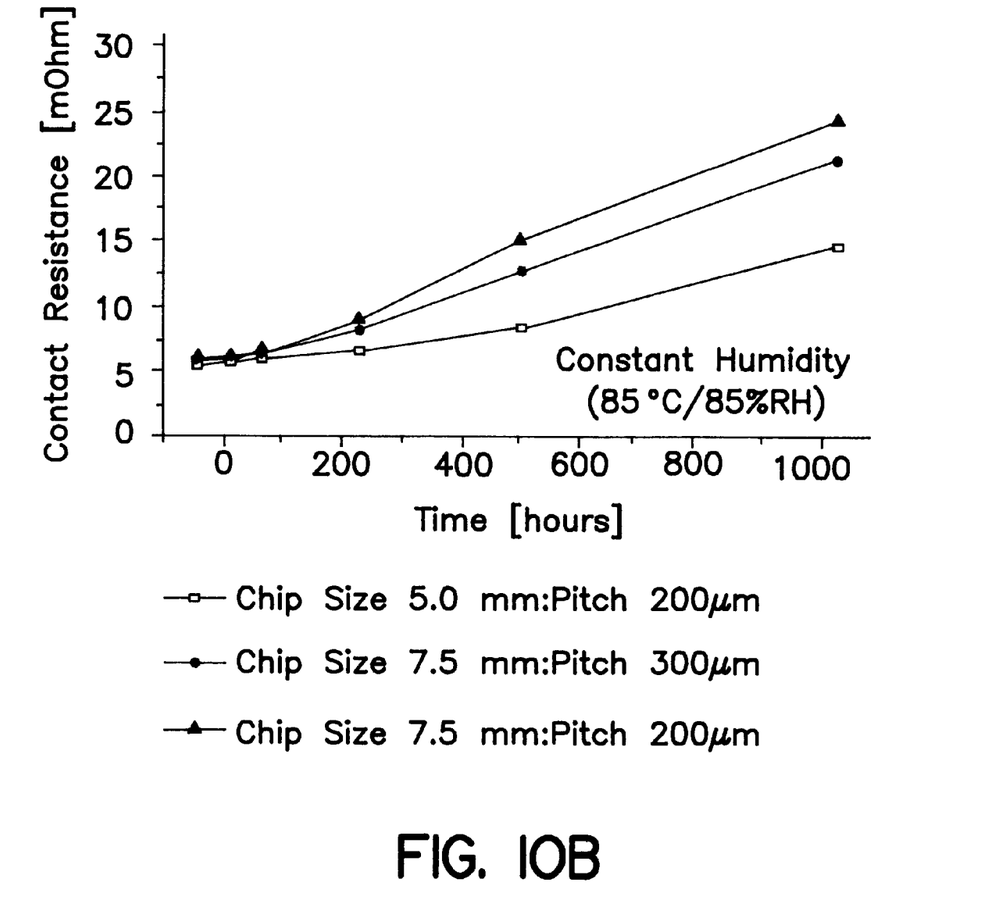

Electrical Characteristics:

The electrical characteristics were studied by monitoring the contact resistance and transit resistance after the reliability tests. Results are summarized in FIGS. 9a, 9b, 10a, and 10b After 1000 temperature cycles no open joints for the chips bonded to both substrates were observed. However, the degradation of the resistance of the 7.5 mm square chip increased slowly with the number of cycles, reaching a value twice as large as the initial condition (see FIGS. 9a, 10a). In the case of the 5 mm square chip, the connection resistance was nearly constant. The reason for the change in contact resistance can be attributed to the stress-induced contact spacing changes between the gold ball bumps and the electrodes of the substrate. In comparison with solder joints, where reliability problems arise from fatigue failures during thermal cyclings (CTE differences), adhesive joints tend to be more compliant and less susceptible to fatigue failure. In contrast to temperature cycling, humidity testing caused higher contact resistance values (see FIGS. 9b, 10b). In the case of the FR-4 board (see FIG. 9b) the values after 1000 hours were independent of the chip size. The measured value was approximately 27 mΩ with a small standard deviation of ±4.5 mΩ. The results for the flexible polyimide substrate (see FIG. 10b) exhibit a better stability, especially for the 5 mm square chip. Possible causes for the high contact resistance are the change in volume when the adhesive swells in z-axis direction due to moisture absorption or an oxidation effect. To obtain excellent reliability and interconnection stability, a bonding load was selected by the thickness of the adhesive, by the bumpheight and by the given bonding parameters of the adhesives. The force was adjusted until there was no further reduction in contact resistance.

The best results could be achieved with bond forces in the range of 80 to 100 g/bump. Despite these high bond forces no cracks occurred during bonding, neither on chip nor on substrate.

Another point to obtain high reliability is to have compliance in the interconnection. This compliance is required to compensate for non-planarities of the substrate and thermal mismatch of the interconnection materials. Under operating conditions the thermal mismatch difference in z-direction between the gold ball bump and the adhesive will expand the adhesive faster than the bumps. This leads to early failures when there is no compliance. Therefore, the behavior of the flip chip interconnects was checked by a temperature operating test. The specimen was heated up from 25° C. to 125° C., in increments of 25° C., and held at each temperature for measuring the contact resistance.

Figure 11:
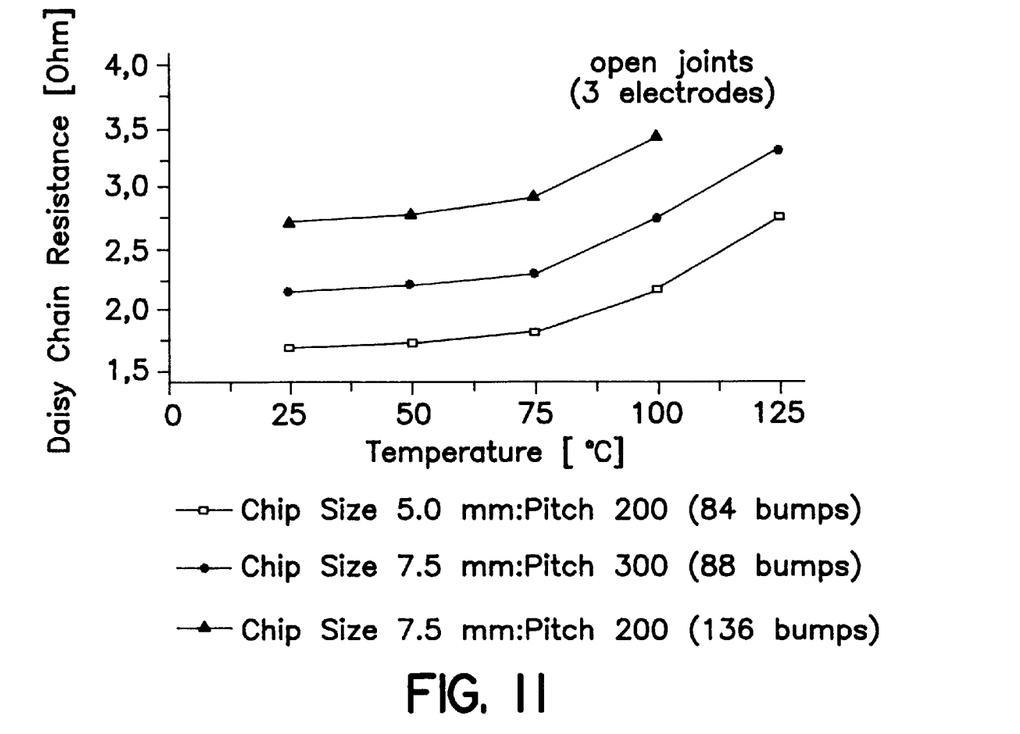
FIG. 11 shows temperature dependant resistance.

FIG. 11 shows the relationship between the contact resistance of the electrodes and the temperature. The resistance increases gradually for all devices from 5 mΩ to approximately 8 mΩ. Compared to the first investigation, which was performed at lower bond temperature, no electrical contact failures were observed even after 125° C. The higher contact resistance disappeared when returned to room temperature.

Figure 12:
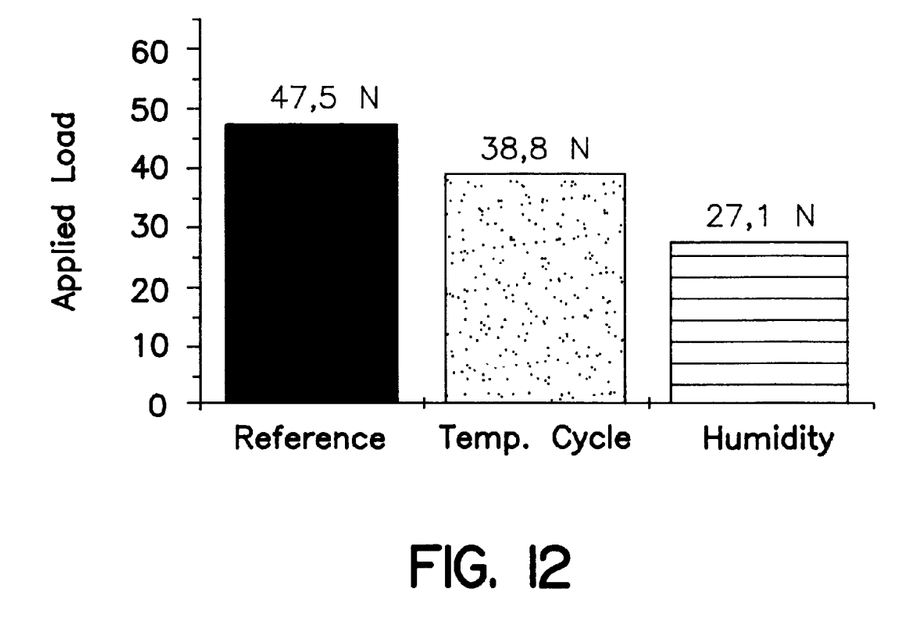
FIG. 12 shows the influence of humidity and temperature on bonding strength.

Mechanical Characteristics:

The adhesive strength was evaluated by a tensile tester (Instron 4502) on the rigid printed circuit boards. The board was clamped to a plate and the load was applied directly from above. The peel strength tests were carried out on the 7.5 mm square chips employed in the two environmental tests, and compared with a sample stored at room temperature. The results in FIG. 12 show the influence of the environmental tests on the flip chip joint. For all samples the failure mode was an adhesion failure at the interface between the adhesive and the solder mask on the printed circuit board. Cohesive failure was never observed in this test.

Suggested is a flip chip technology using non-conductive adhesives and gold ball bumps or connectors. The concept is to simultaneously attach and interconnect bare chips with gold ball bumps to organic substrates. The chip is fixed by cooling the insulative adhesive. Environmental testing has demonstrated that performance characteristics were acceptable after 1000 hours of continuous exposure to humidity, and were excellent after 1000 temperature cycles. Such stable interconnections can only be realized by the compliance of the flip chip joint. This stability can be achieved by precise control of the bonding parameters such as temperature and pressure. This bonding technique allows quality attachment of bare chips on low cost organic substrates.

What is claimed is:

1. Method for the simultaneous mechanically attaching and electrically connecting of a bare chip with a plurality of bumps to a flexible organic substrate carrying a conductive printed pattern, said method comprising:

(a) covering the flexible organic substrate with an adhesive film comprising an insulative non conductive thermosetting and thermoplastic blend adhesive;

(b) aligning the bumps to the conductive printed pattern;

(c) bonding the chip face down with its bumps through the film to the conductive printed pattern on the flexible organic substrate with a load of minimum 20 kg/cm$^2$ and at an elevated temperature up to 180° C. for 15 sec to 20 sec, until the whole chip is fixed to the substrate.

2. Method according to claim 1, comprising the deforming of the bumps, especially in their front section being softer than their body section.

3. Method according to claim 1, the blend adhesive being a sheet foil.

4. Method according to claim 1, wherein the load results in a bonding force being in the range of 80 g to 100 g per bump.

5. Method according to claim 1, whereby the bumps have a base and a peak section being connected via a conical section.

6. Method according to claim 1, the bumps being formed of gold.

7. Method according to claim 1, the film having a one of a thickness of 25 $\mu$m and 50 $\mu$m, manufactured in a dry film format.

\* \* \* \* \*

UNITED STATES PATENT AND TRADEMARK OFFICE
CERTIFICATE OF CORRECTION

PATENT NO. : 5,928,458
DATED      : July 27, 1999
INVENTOR(S): Aschenbrenner, et. al.

It is certified that error appears in the above-identified patent and that said Letters Patent is hereby corrected as shown below:

Claim 1, line 12, delete "." after "180°C".

Claim 7, line 28, delete "one of" and insert "one" after "thickness".

Signed and Sealed this

Thirtieth Day of May, 2000

Attest:

Q. TODD DICKINSON

Attesting Officer

Director of Patents and Trademarks